United States Patent
Yang et al.

(10) Patent No.: US 11,761,719 B1
(45) Date of Patent: Sep. 19, 2023

(54) TWO-PHASE IMMERSION-TYPE HEAT DISSIPATION STRUCTURE HAVING FINS WITH DIFFERENT THERMAL CONDUCTIVITIES

(71) Applicant: AMULAIRE THERMAL TECHNOLOGY, INC., New Taipei (TW)

(72) Inventors: Ching-Ming Yang, New Taipei (TW); Chun-Te Wu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 17/968,804

(22) Filed: Oct. 19, 2022

(51) Int. Cl.
F28F 13/14 (2006.01)
H05K 7/20 (2006.01)

(52) U.S. Cl.
CPC .......... *F28F 13/14* (2013.01); *F28F 2215/04* (2013.01); *H05K 7/208* (2013.01)

(58) Field of Classification Search
CPC ... F28F 13/14; F28F 2215/04; F28F 2013/008
USPC ....................................................... 165/80.4
See application file for complete search history.

(56) References Cited

U.S. PATENT DOCUMENTS

| | | | |
|---|---|---|---|
| 6,554,060 B2 * | 4/2003 | Noda ......................... | F28F 3/02 174/16.3 |
| 6,698,500 B2 * | 3/2004 | Noda ................... | H01L 23/3672 174/16.3 |
| 7,069,737 B2 * | 7/2006 | Wang .................... | H01L 23/473 257/E23.098 |
| 10,816,283 B2 * | 10/2020 | Kusano ................... | F28F 3/027 |
| 11,252,842 B2 * | 2/2022 | Jeong ................... | H01L 23/3736 |

* cited by examiner

*Primary Examiner* — Jon T. Schermerhorn, Jr.
(74) *Attorney, Agent, or Firm* — Li & Cai Intellectual Property Office

(57) ABSTRACT

A two-phase immersion-type heat dissipation structure having fins with different thermal conductivities is provided. The two-phase immersion-type heat dissipation structure includes a heat dissipation substrate, and a plurality of fins. The heat dissipation substrate has a fin surface and a non-fin surface that face away from each other. The non-fin surface is configured to be in contact with a heating element immersed in a two-phase coolant. The fin surface is connected with the plurality of fins. At least one of the plurality of fins is a functional fin that is made of a single metal material and has two or more thermal conductivities. A thermal conductivity of a lower portion of the functional fin that is connected with the heat dissipation substrate is lower than thermal conductivities of other portions of the functional fin.

6 Claims, 7 Drawing Sheets

TWO-PHASE IMMERSION-TYPE HEAT DISSIPATION STRUCTURE HAVING FINS WITH DIFFERENT THERMAL CONDUCTIVITIES

FIELD OF THE DISCLOSURE

The present disclosure relates to a heat dissipation structure, and more particularly to a two-phase immersion-type heat dissipation structure having fins with different thermal conductivities.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides a two-phase immersion-type heat dissipation structure having fins with different thermal conductivities.

In one aspect, the present disclosure provides a two-phase immersion-type heat dissipation structure. The two-phase immersion-type heat dissipation structure includes a heat dissipation substrate, and a plurality of fins. The heat dissipation substrate has a fin surface and a non-fin surface that face away from each other. The non-fin surface is configured to be in contact with a heating element immersed in a two-phase coolant. The fin surface is connected with the plurality of fins. At least one of the plurality of fins is a functional fin that is made of a single metal material and has two or more thermal conductivities. A thermal conductivity of a lower portion of the functional fin that is connected with the heat dissipation substrate is lower than thermal conductivities of other portions of the functional fin.

In certain embodiments, a difference between the thermal conductivity of the lower portion of the functional fin that is connected with the heat dissipation substrate and the thermal conductivities of other portions of the functional fin is less than 20%.

In certain embodiments, the lower portion of the functional fin that is connected with the heat dissipation substrate has an indentation or a crease formed thereon through localized processing using forging, extrusion, or bending, and wherein an area of a portion of the functional fin that is processed through the localized processing is from 5% to 20% of a total area of the functional fin.

In certain embodiments, the functional fin is made of one of copper, copper alloy, aluminum, and aluminum alloy.

In certain embodiments, the plurality of fins are plate-fins, wherein each of the plate-fins has a thickness of from 0.1 mm to 0.5 mm, and a height of less than or equal to 10 mm, and wherein any adjacent two of the plate-fins have a distance of from 0.1 mm to 0.5 mm therebetween.

In certain embodiments, the plurality of fins are pin-fins, wherein each of the pin-fins has a diameter of from 0.1 mm to 0.5 mm, and a height of less than or equal to 6 mm, and wherein any adjacent two of the pin-fins have a distance of from 0.1 mm to 0.5 mm therebetween.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
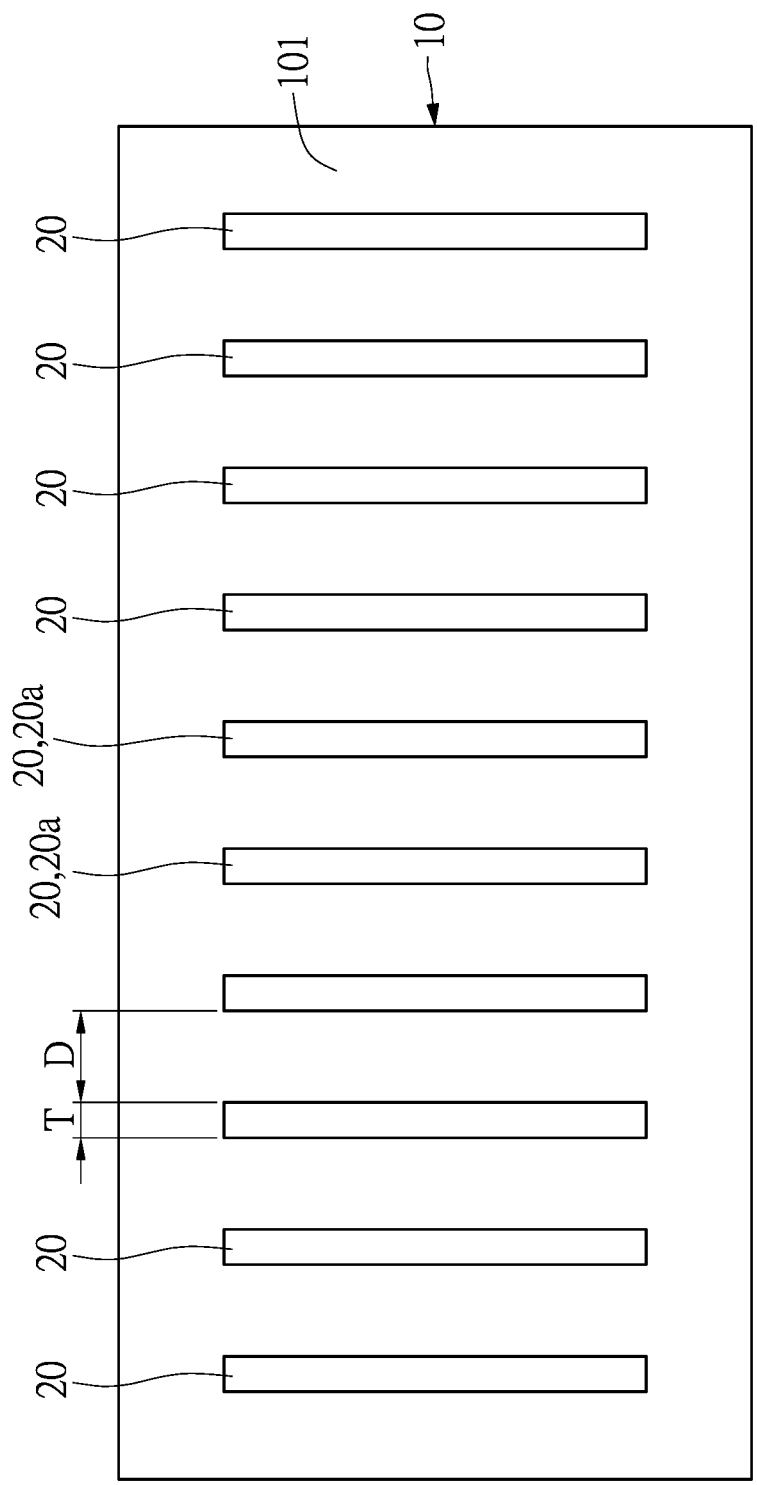
FIG. 1 is a schematic top view of a two-phase immersion-type heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
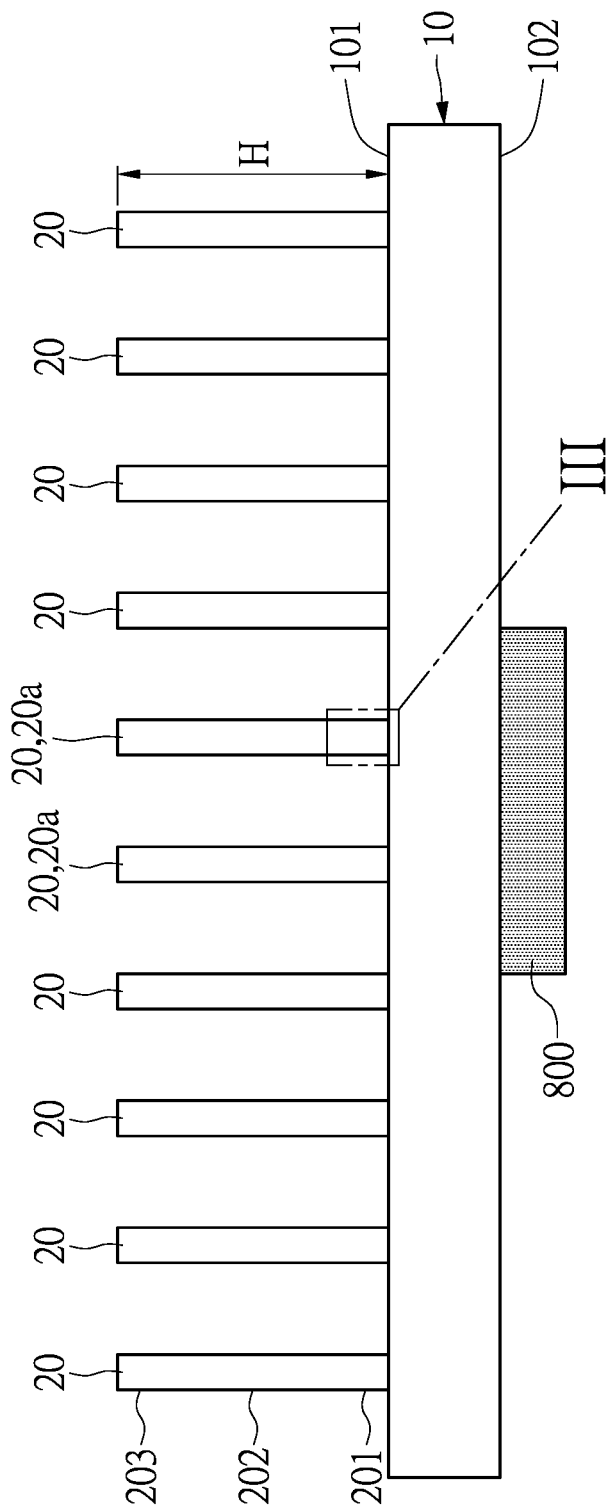
FIG. 2 is a schematic side view of the two-phase immersion-type heat dissipation structure according to the first embodiment of the present disclosure.

Referring to FIG. 1 to FIG. 4, a first embodiment of the present disclosure provides a two-phase immersion-type heat dissipation structure having fins with different thermal conductivities for contacting a heating element immersed in a two-phase coolant. As shown in FIG. 1 and FIG. 2, the two-phase immersion-type heat dissipation structure according to the first embodiment of the present disclosure includes a heat dissipation substrate 10, and a plurality of fins 20.

In this embodiment, the heat dissipation substrate 10 has a fin surface 101 and a non-fin surface 102 that face away from each other. The non-fin surface 102 is configured to be in contact (e.g., in direct contact, or in indirect contact via an intermediate layer) with a heating element 800 immersed in a two-phase coolant. The fin surface 101 is connected with the plurality of fins 20, and the heat dissipation substrate 10 and the plurality of fins 20 can be integrally connected with each other by metal injection molding or skiving. The heat dissipation substrate 10 and the plurality of fins 20 can also be connected by soldering. Moreover, the plurality of fins 20 can be plate-fins, each of the plate-fins preferably has a thickness T of from 0.1 mm to 0.5 mm, any adjacent two of the plate-fins preferably have a distance of from 0.1 mm to 0.5 mm therebetween, and a height of each of the plate-fins is preferably less than or equal to 10 mm.

In this embodiment, at least one of the plurality of fins 20 is a functional fin 20a that is made of a single metal material (such as copper, copper alloy, aluminum, and aluminum alloy) and has two or more thermal conductivities. Furthermore, a thermal conductivity of a lower portion 201 of the functional fin 20a that is connected with the heat dissipation substrate 10 is lower than thermal conductivities of other portions of the functional fin 20a.

Figure 3:
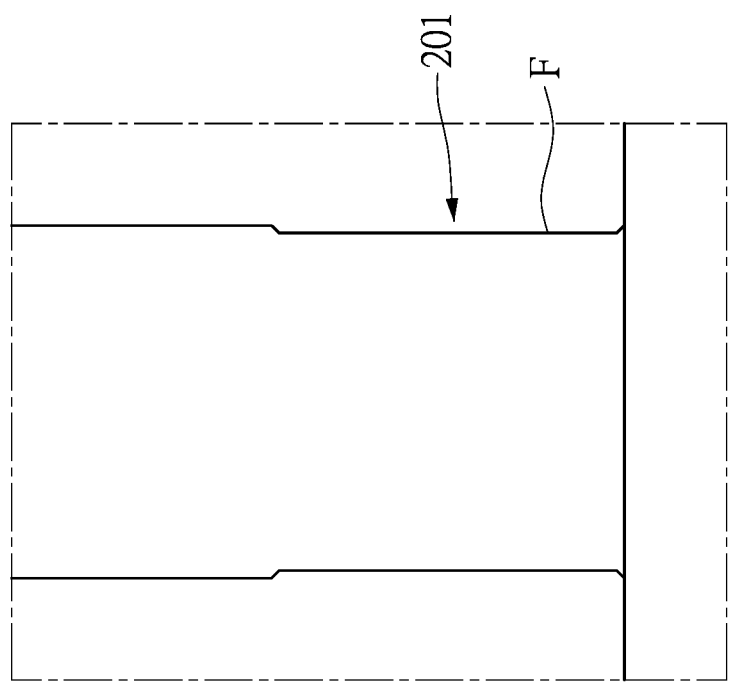
FIG. 3 is an enlarged view of part III of FIG. 2.
Figure 4:
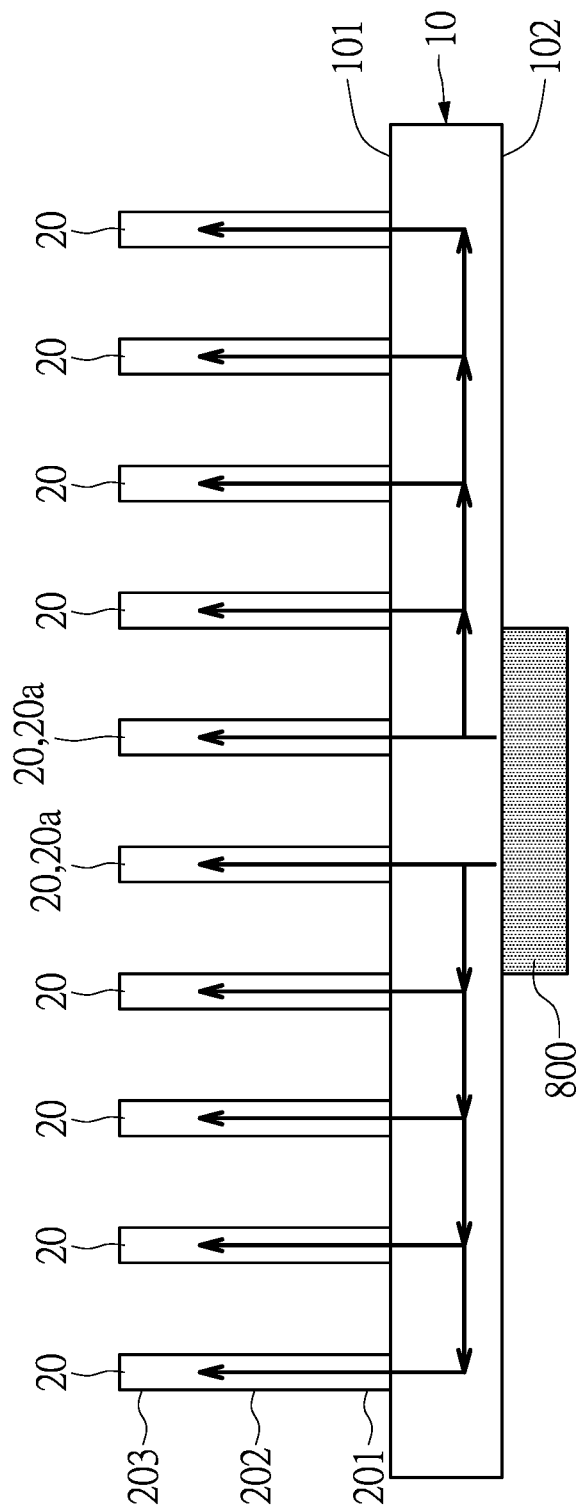
FIG. 4 is a schematic view of a thermal conduction path according to the first embodiment of the present disclosure.

In more detail, the lower portion 201 of the functional fin 20a that is connected with the heat dissipation substrate 10 can have an indentation F (as illustrated in FIG. 3) formed thereon by a partial processing manner of forging or extrusion, so that the functional fin 20a that is made of a single metal material can have two or more thermal conductivities. Furthermore, after the indentation F is formed on the lower portion 201 of the functional fin 20a through forging or extrusion, a thermal conductivity of the lower portion 201 of the functional fin 20a is lower than the thermal conductivities of other portions of the functional fin 20a, so that an amount of heat conducted to the plurality of fins 20 on the heat dissipation substrate 10 can be uniformly distributed, and most of the plurality of fins 20 can be properly utilized. In addition, none of the plurality of fins 20 is formed by soldering different metal materials, so that high interface thermal resistance does not occur in this embodiment.

Moreover, in order to avoid an excessive increase in a temperature of the heating element 800, a thermal conductivity of the lower portion 201 of the functional fin 20a needs to be prevented from being excessively decreased. In this embodiment, a difference between the thermal conductivity of the lower portion 201 of the functional fin 20a and the thermal conductivities of other portions of the functional fin 20a is required to be less than 20%. For example, the functional fin 20a of this embodiment can be made of copper, and a thermal conductivity of copper can be approximately 400 W/mK, so that a lowest thermal conductivity of the lower portion 201 of the functional fin 20a can be approximately 320 W/mK, and preferably is 360 W/mK. That is, a difference between the thermal conductivity of the lower portion 201 of the functional fin 20a and the thermal conductivities of other portions of the functional fin 20a is approximately 10%.

The lower portion 201 of the functional fin 20a can have the indentation F formed thereon by the localized processing manner of forging or extrusion, and a center portion 202 that is integrally connected to an upper portion 203 and the lower portion 201 of the functional fin 20a can also have the indentation F formed thereon by the localized processing manner of forging or extrusion. Therefore, the functional fin 20a that is made of a single metal material can have thermal conductivities that are increased in a stepwise manner. Moreover, a total area of a portion of the functional fin 20a that is processed by the localized processing manner is from 5% to 20% of a total area of the functional fin.

In this embodiment, at least two functional fins 20a of the plurality of fins 20 correspond in position to locations above the heating element 800, so as to prevent heat absorbed by the heat dissipation substrate 10 to be mostly transferred only to one portion of the fins 20 above the heating element 800 through a shorter thermal conduction path. Accordingly, heat absorbed by the heat dissipation substrate 10 can also be transferred to another portion of the fins 20 that are away from the heating element 800 through a longer thermal conduction path (as illustrated by arrows in FIG. 4), so that the another portion of the fins 20 that are away from the heating element 800 can also be properly utilized.

In this embodiment, the plurality of fins 20 can all be functional fins 20a. In another embodiment, a leftmost one and a rightmost one of the plurality of fins 20 can be fins that are made of a single metal material and have only a single thermal conductivity.

Second Embodiment

Figure 5:
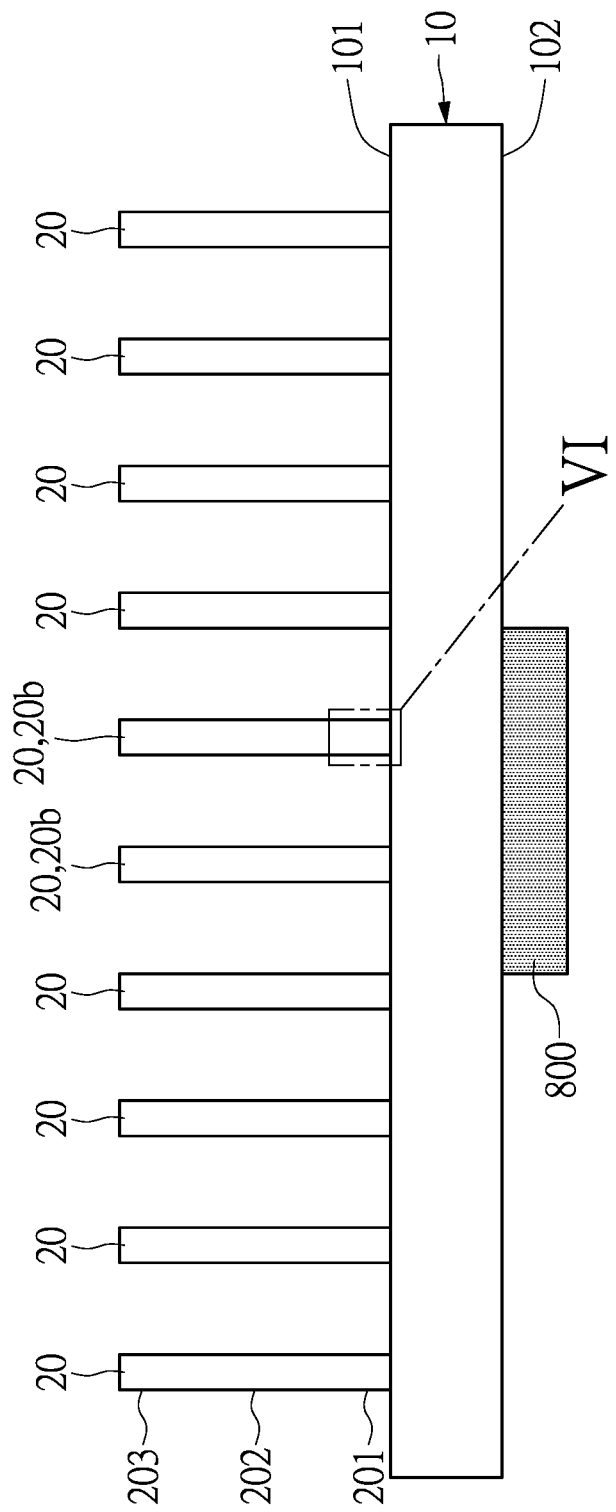
FIG. 5 is a schematic side view of a two-phase immersion-type heat dissipation structure according to a second embodiment of the present disclosure.
Figure 6:
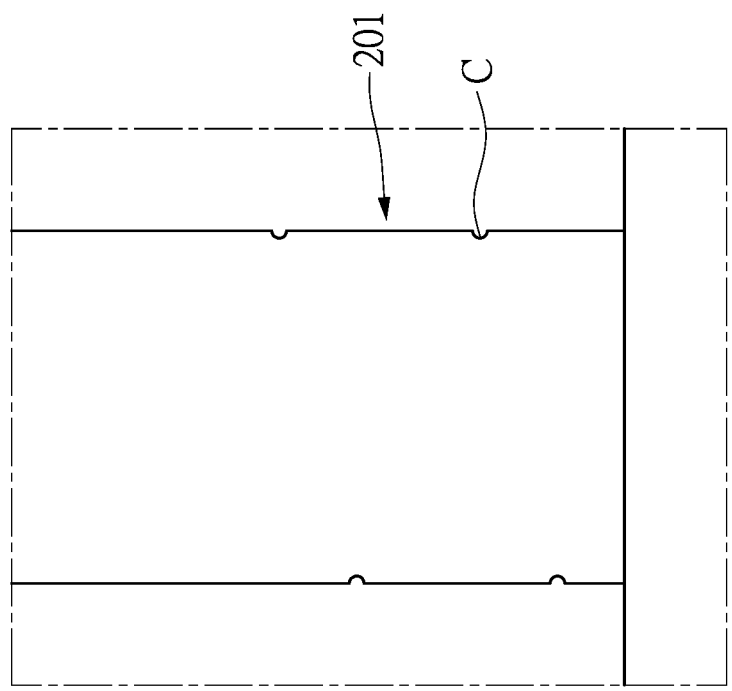
FIG. 6 is an enlarged view of part VI of FIG. 5.

Referring to FIG. 5 and FIG. 6, a second embodiment of the present disclosure is substantially the same as the first embodiment, and the difference therebetween is described as follows.

In this embodiment, a lower portion 201 of a functional fin 20b that is connected with the heat dissipation substrate 10 can have a crease C (as illustrated in FIG. 6) formed thereon by a localized processing manner of bending, so that the functional fin 20b that is made of a single metal material can have two or more thermal conductivities.

Third Embodiment

Figure 7:
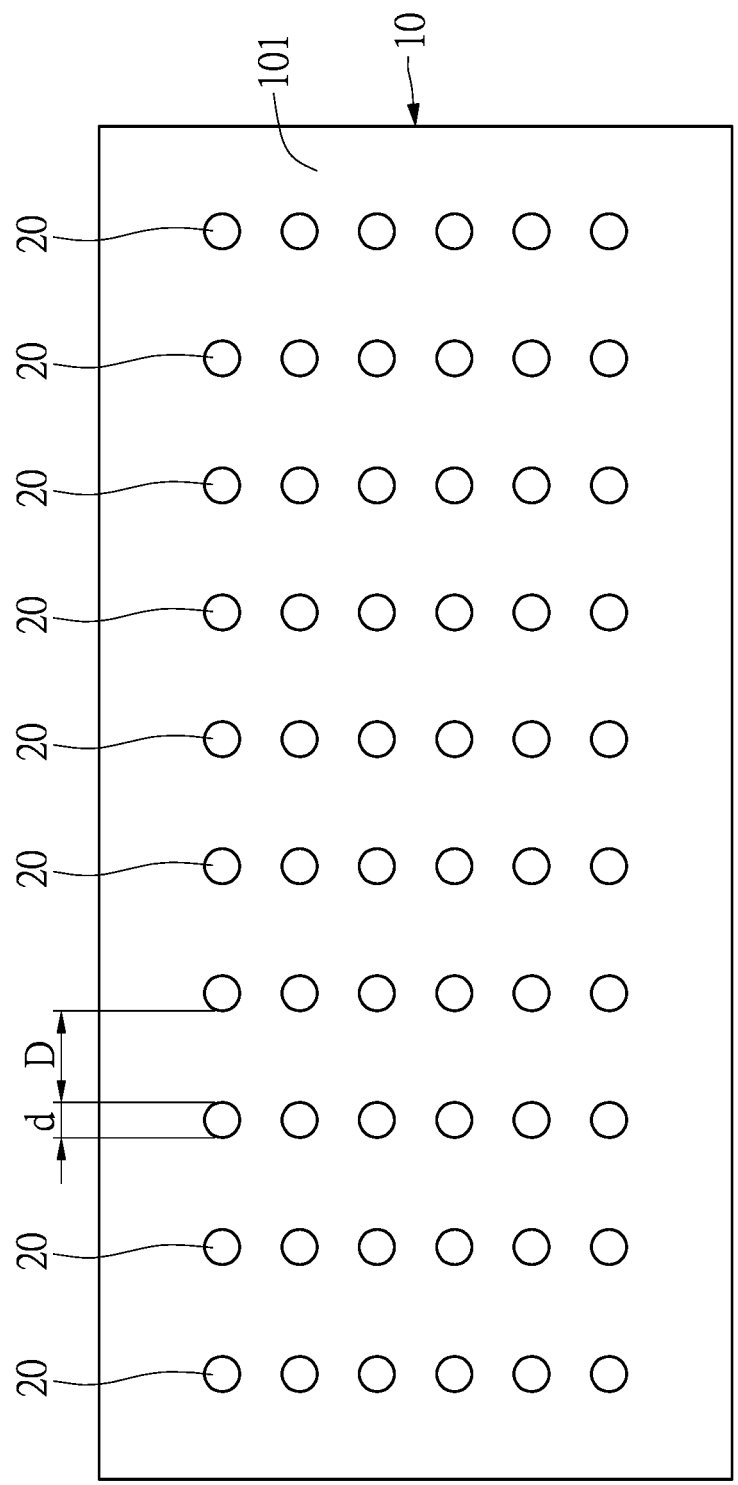
FIG. 7 is a schematic top view of a two-phase immersion-type heat dissipation structure according to a third embodiment of the present disclosure.

Referring to FIG. 7, a third embodiment of the present disclosure is substantially the same as the first embodiment and the second embodiment, and the difference therebetween is described as follows.

In this embodiment, the plurality of fins 20 can be pin-fins, each of the pin-fins has a diameter that is preferably from 0.1 mm to 0.5 mm, and any adjacent two of the pin-fins preferably have a distance D of from 0.1 mm to 0.5 mm therebetween. Similar to the first embodiment, a height of each of the pin-fins is preferably less than or equal to 6 mm.

Beneficial Effects of the Embodiments

In conclusion, in the two-phase immersion-type heat dissipation structure having fins with different thermal conductivities, by technical features of "a heat dissipation substrate having a fin surface and a non-fin surface that face away from each other, the non-fin surface being configured to be in contact with a heating element immersed in a two-phase coolant, and the fin surface being connected with the plurality of fins," "at least one of the plurality of fins being a functional fin that is made of a single metal material and has two or more thermal conductivities," and "a thermal conductivity of a lower portion of the functional fin that is connected with the heat dissipation substrate being lower than thermal conductivities of other portions of the functional fin," an amount of heat conducted to the plurality of fins on the heat dissipation substrate can be uniformly distributed, and most of the plurality of fins can be properly utilized, so as to improve an overall immersion-type heat dissipation effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation structure, comprising:
   a heat dissipation substrate having a fin surface and a non-fin surface that face away from each other, wherein the non-fin surface is configured to be in contact with a heating element immersed in a two-phase coolant; and
   a plurality of fins, wherein the fin surface is connected with the plurality of fins, and at least one of the plurality of fins is a functional fin that is made of a single metal material and has two or more thermal conductivities;
   wherein a thermal conductivity of a lower portion of the functional fin that is connected with the heat dissipation substrate is lower than thermal conductivities of other portions of the functional fin.

2. The two-phase immersion-type heat dissipation structure according to claim 1, wherein a difference between the thermal conductivity of the lower portion of the functional fin that is connected with the heat dissipation substrate and the thermal conductivities of other portions of the functional fin is less than 20%.

3. The two-phase immersion-type heat dissipation structure according to claim 1, wherein the lower portion of the functional fin that is connected with the heat dissipation substrate has an indentation or a crease formed thereon by a localized processing manner of forging, extrusion, or bending, and wherein an area of a portion of the functional fin that is processed by the localized processing manner is from 5% to 20% of a total area of the functional fin.

4. The two-phase immersion-type heat dissipation structure according to claim 1, wherein the functional fin is made of one of copper, copper alloy, aluminum, and aluminum alloy.

5. The two-phase immersion-type heat dissipation structure according to claim 1, wherein the plurality of fins are plate-fins, wherein each of the plate-fins has a thickness of from 0.1 mm to 0.5 mm, and a height of less than or equal to 10 mm, and wherein any adjacent two of the plate-fins have a distance of from 0.1 mm to 0.5 mm therebetween.

6. The two-phase immersion-type heat dissipation structure according to claim 1, wherein the plurality of fins are pin-fins, wherein each of the pin-fins has a diameter of from 0.1 mm to 0.5 mm, and a height of less than or equal to 6 mm, and wherein any adjacent two of the pin-fins have a distance of from 0.1 mm to 0.5 mm therebetween.

* * * * *